(12) United States Patent
Corisis

(10) Patent No.: US 7,233,056 B1
(45) Date of Patent: Jun. 19, 2007

(54) CHIP SCALE PACKAGE WITH HEAT SPREADER

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/342,789

(22) Filed: Jun. 29, 1999

Related U.S. Application Data

(62) Division of application No. 09/028,134, filed on Feb. 23, 1998, now Pat. No. 6,314,639.

(51) Int. Cl.
*H01L 23/495* (2006.01)
(52) U.S. Cl. .................. 257/670; 257/737; 257/738; 257/673; 257/675; 257/676; 257/677
(58) Field of Classification Search ............... 257/737, 257/738, 670, 673, 675, 676, 677
See application file for complete search history.

(56) References Cited

U.S. PATENT DOCUMENTS

| | | | |
|---|---|---|---|
| 4,024,570 A | 5/1977 | Hartmann et al. |
| 4,143,456 A | 3/1979 | Inoue |
| 4,264,917 A | 4/1981 | Ugon |
| 4,300,153 A | 11/1981 | Hayakawa et al. |
| 4,358,552 A | 11/1982 | Shinohara et al. |
| 4,507,675 A | 3/1985 | Fujii et al. |
| 4,594,770 A | 6/1986 | Butt |
| 4,642,671 A | 2/1987 | Rohsler et al. |
| 4,931,852 A | 6/1990 | Brown et al. |
| 4,961,107 A | 10/1990 | Geist et al. |
| 5,073,521 A | 12/1991 | Braden |
| 5,101,465 A | 3/1992 | Murphy |
| 5,173,764 A | 12/1992 | Higgins, III |
| 5,194,930 A | 3/1993 | Papathomas et al. |
| 5,214,845 A | 6/1993 | King et al. |
| 5,233,220 A | 8/1993 | Lamson et al. |
| 5,378,924 A | 1/1995 | Liang |
| 5,379,186 A | 1/1995 | Gold et al. |
| 5,379,187 A | 1/1995 | Lee et al. |
| 5,387,554 A | 2/1995 | Liang |
| 5,434,105 A | 7/1995 | Liou |
| 5,436,203 A | 7/1995 | Lin |
| 5,450,283 A | 9/1995 | Lin et al. |
| 5,488,254 A | 1/1996 | Nishimura et al. |
| 5,489,538 A | 2/1996 | Rostoker et al. |
| 5,489,801 A | 2/1996 | Blish, II |
| 5,490,324 A | 2/1996 | Newman |
| 5,528,076 A * | 6/1996 | Pavio |
| 5,541,446 A | 7/1996 | Kierse |
| 5,550,408 A | 8/1996 | Kunitomo et al. |
| 5,559,306 A | 9/1996 | Mahulikar |
| 5,594,282 A | 1/1997 | Otsuki |
| 5,596,231 A | 1/1997 | Combs |
| 5,598,034 A | 1/1997 | Wakefield |

(Continued)

*Primary Examiner*—David E. Graybill
(74) *Attorney, Agent, or Firm*—TraskBritt

(57) ABSTRACT

A dense semiconductor flip-chip device assembly is provided with a heat sink/spreading/dissipating member that is formed as a paddle of a metallic paddle frame in a strip of paddle frames. Semiconductor dice are bonded to the paddles by, e.g., conventional semiconductor die attachment methods, enabling bump attachment and testing to be conducted before detachment from the paddle frame strip.

37 Claims, 4 Drawing Sheets

U.S. PATENT DOCUMENTS

| | | |
|---|---|---|
| 5,606,199 A * | 2/1997 | Yoshigai |
| 5,661,086 A | 8/1997 | Nakashima et al. |
| 5,708,567 A | 1/1998 | Shim et al. |
| 5,773,896 A * | 6/1998 | Fujimoto et al. |
| 5,834,848 A | 11/1998 | Iwasaki |
| 5,868,953 A | 2/1999 | Akram et al. |
| 5,884,396 A | 3/1999 | Lin |
| 5,907,769 A | 5/1999 | Corisis |
| 5,917,702 A | 6/1999 | Barrow |
| 5,923,090 A * | 7/1999 | Fallon et al. ............... 257/777 |
| 5,938,956 A | 8/1999 | Hembree et al. |
| 6,403,882 B1 | 6/2002 | Chen et al. |

* cited by examiner

CHIP SCALE PACKAGE WITH HEAT SPREADER

CROSS-REFERENCE TO RELATED APPLICATION

This application is a divisional of application Ser. No. 09/028,134, filed Feb. 23, 1998, now U.S. Pat. No. 6,314,639, issued Nov. 13, 2001.

BACKGROUND OF THE INVENTION

1. Field of the Invention

This invention relates generally to semiconductor device assemblies. More particularly, the invention pertains to a method for producing a chip-on-board semiconductor device assembly with a heat spreading/dissipating member, and the device produced thereby.

2. State of the Art

In the design and production of modern integrated circuits (IC), an important consideration is the dissipation of heat generated in the semiconductor device. Elevated temperatures may cause irreparable damage to the semiconductor die and its electrical connections.

Various methods for preventing excessive temperatures in a semiconductor device have been in use.

Thus, for low-power devices of less than about 1 watt, the metal lead frame itself may be sufficient to dissipate generated heat. Lead frame configurations for improved heat dissipation are shown in U.S. Pat. No. 5,541,446 of Kierse, U.S. Pat. No. 4,961,107 of Geist et al., and U.S. Pat. No. 5,101,465 of Murphy.

For higher power packaged devices, a metal heat spreader may be incorporated into the package or attached to the outside of the package. Because of the generally low thermal conductivity of polymers, the heat dissipation design is more critical for polymer-packaged devices than for those packaged in ceramic or metal.

Heat spreaders/heat sinks/heat dissipaters in packaged semiconductor devices are often used to conduct heat to the exterior of the devices, either directly or via the leads. A wide variety of such is illustrated in U.S. Pat. No. 5,596,231 of Combs, U.S. Pat. No. 5,594,282 of Otsuki, U.S. Pat. No. 5,598,034 of Wakefield, U.S. Pat. No. 5,489,801 to Blish II, U.S. Pat. No. 4,024,570 of Hartmann et al., U.S. Pat. Nos. 5,378,924 and 5,387,554 of Liang, U.S. Pat. No. 5,379,187 of Lee et al., U.S. Pat. No. 4,507,675 of Fujii et al., U.S. Pat. No. 4,642,671 of Rohsler et al., U.S. Pat. No. 4,931,852 of Brown et al., U.S. Pat. No. 5,173,764 of Higgins III, U.S. Pat. No. 5,379,186 to Gold et al., U.S. Pat. No. 5,434,105 to Liou, and U.S. Pat. No. 5,488,254 to Nishimura et al.

The above-indicated references may be characterized as providing complex devices requiring difficult and/or costly processes to achieve the desired heat dissipation. Most of the references are not applicable at all to a high density device attached in a bare state to a substrate such as a circuit board.

Encapsulation compositions and methods are shown in U.S. Pat. No. 4,358,552 to Shinohara et al. and U.S. Pat. No. 5,194,930 to Papathomas et al.

SUMMARY OF THE INVENTION

The present invention comprises a high density semiconductor device assembly for electrical connection without wires to a substrate such as a circuit board. In a preferred embodiment, the invention comprises a chip-on-board (COB) device with a heat spreader/dissipater on its back side. The active surface on its "front side" may be attached in a bare die state to the substrate by lead bond methods known in the art preferably by ball-grid-array (BGA) methods which simultaneously complete each of the conductive bonds between the semiconductor die and the circuit board.

The present invention also encompasses a "paddle frame" strip for (a) providing a heat spreader/dissipater on each semiconductor die, (b) supporting the semiconductor dice for die testing and/or (c) supporting the semiconductor dice for applying conductive bumps to the bond pads. The paddle frame strip may incorporate any number of paddle frames, and preferably has at least eight paddle frames.

The present invention further comprises a method for producing the high density semiconductor device with the heat spreader/dissipater.

The present invention provides significant advantages in the production of dense semiconductor devices, including enhanced reliability, ease of production, and reduced production costs.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

An improved high density semiconductor device assembly is provided by the present invention which is configured to be electrically attached to a substrate, such as a circuit board, by array bonding. A series of bare semiconductor devices of the invention may be mounted on a substrate in a closely packed arrangement. The semiconductor device is provided with a heat sink/spreading/dissipating member. Following mounting on a substrate, the device or plurality of devices may be "packaged" with a protective polymeric sealer.

The semiconductor device assembly and a method for producing it are described hereinbelow and illustrated in drawing FIGS. 1–5.

Figure 1:
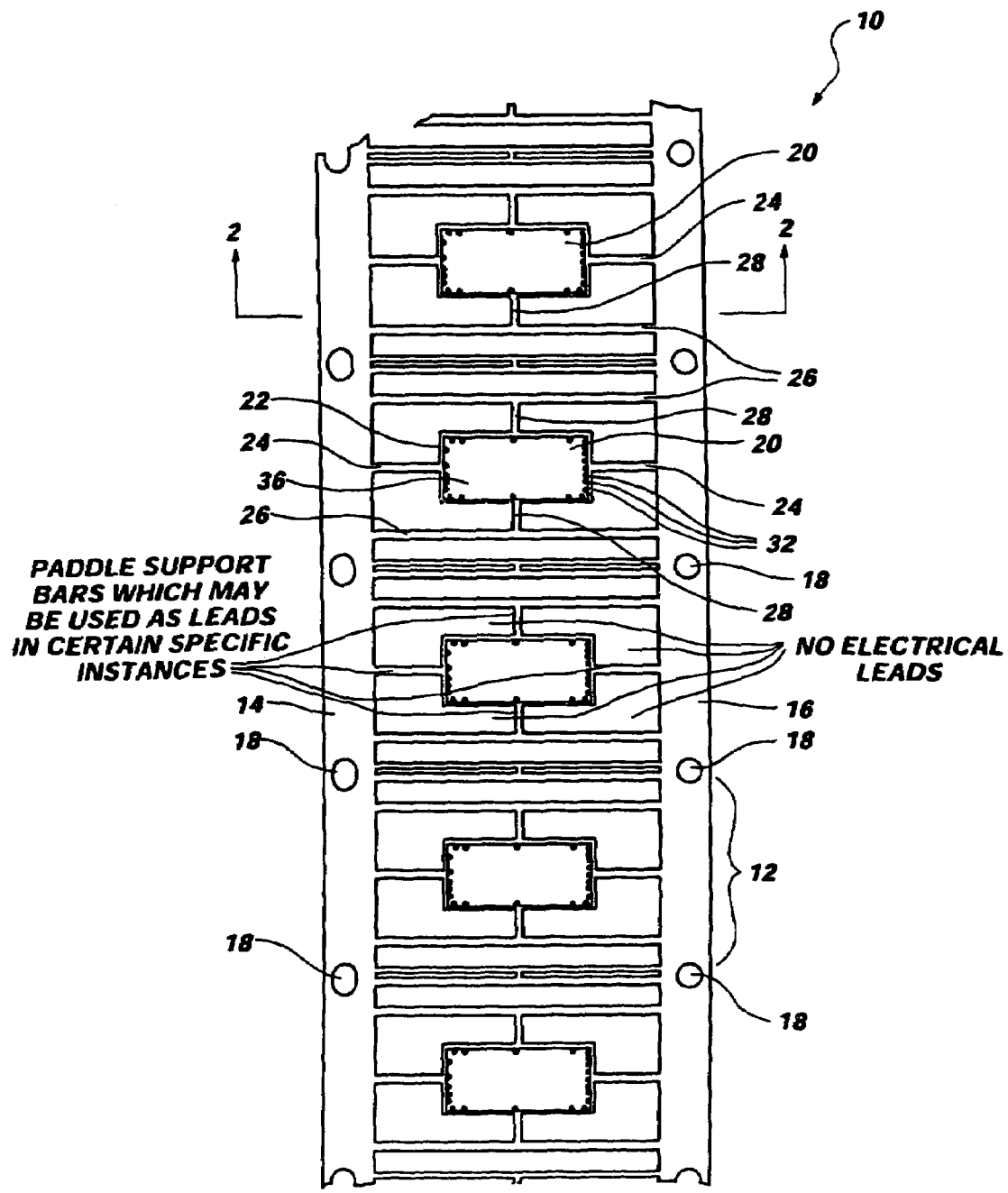
FIG. 1 is a plan view of a portion of a paddle frame and attached semiconductor dice of the heat spreading chip scale package of the invention.
Figure 1A:
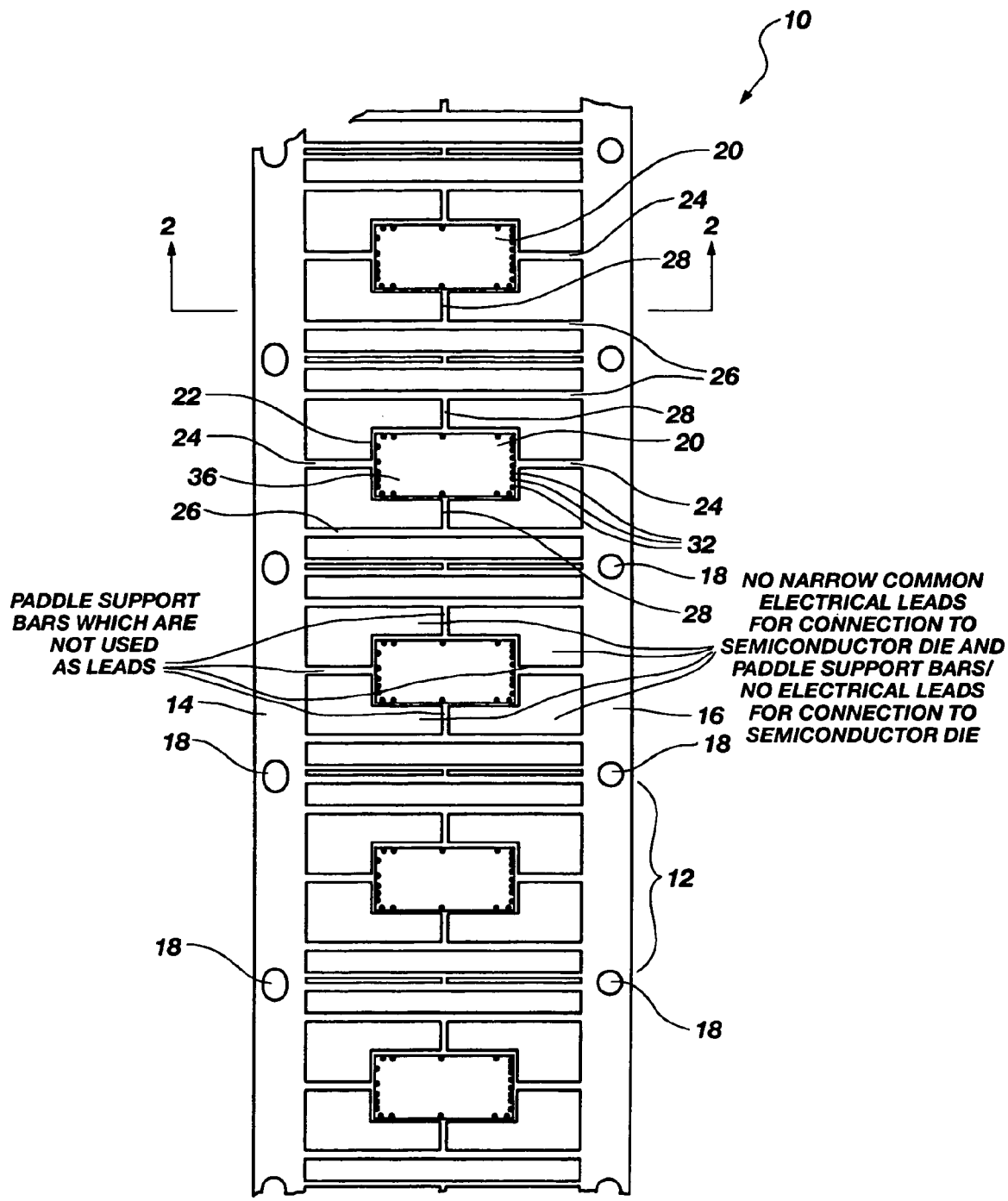
FIG. 1A is a plan view of a portion of a paddle frame and attached semiconductor dice of the heat spreading chip scale package of the invention.
Figure 2:
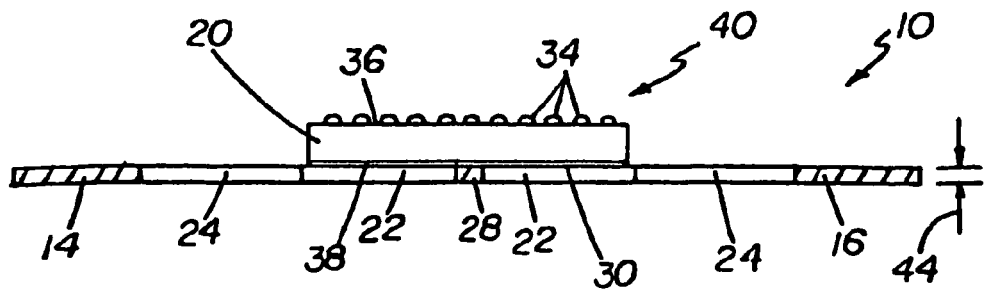
FIG. 2 is a cross-sectional side view of a semiconductor die bonded to a paddle frame in accordance with the heat spreading chip scale package of the invention, as taken along line 2—2 of FIG. 1.
Figure 4:
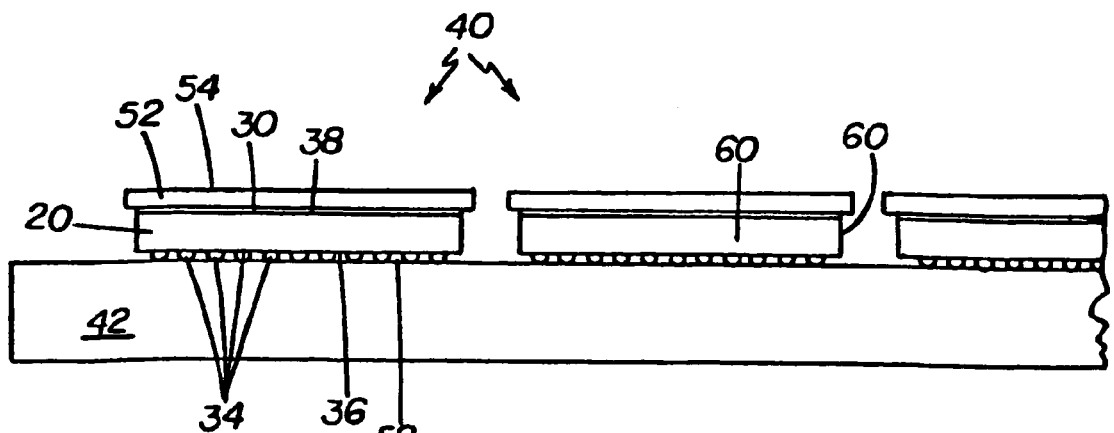
FIG. 4 is a side view of a circuit board upon which are reversibly mounted paddle-bonded semiconductor dice with ball grid arrays in accordance with the heat spreading chip scale package of the invention.

With reference to the drawings of FIGS. 1, 1A, and 2, a metal strip 10 of heat conductive material is configured with multiple paddle frames 12. The metal strip 10 has left and right side rails 14, 16 and a series of sprocket holes 18 in the side rails for precise positioning of processing equipment and a plurality of semiconductor dice 20 which are attached to the metal strip. Each paddle frame 12 includes the side rails 14, 16, cross-members 26, and a generally centrally positioned metal paddle 22 which is attached to the side rails 14, 16 by paddle support bars 24 and to cross-members 26 by paddle support bars 28. A semiconductor die 20, having a first major surface 36 and an opposing second major surface 38, has second major surface 38 attached to a metal paddle 22 by semiconductor die attachment methods known in the art. Exemplary of such semiconductor die attachment methods is attachment using a semiconductor die attach layer 30 of electrically non-conductive polymeric adhesive such as epoxy or polyimide. Alternatively, a semiconductor die attach layer 30 may be electrically conductive. As known in the art, a metal filled polymer, an unfilled conductive polymer such as a silver filled epoxy or polyimide, or a conductive gold-silicon eutectic material may be used. Thus, the semiconductor die attach layer 30 may be electrically conductive or insulative, depending upon the circuit configuration of the second major semiconductor die surface 38. Thus, for example, the second major surface 38 may be designed to be grounded to a ground plane surface, which may be the metal paddle 22.

The metal paddle 22 acts as a heat spreader/dissipater in the final semiconductor device assembly 40. Thus, while the semiconductor die attach layer 30 may be either electrically conductive or insulative, it preferably has an enhanced heat conductivity. Where the metal paddle 22 comprises a metal layer attached to a polymer layer, the semiconductor die attach layer 30 is attached to the metal surface 48 to enhance heat transfer (see drawing FIG. 3).

Each metal strip 10 with paddle frames 12 may be formed in the same manner as are lead frames in the art. The number of paddle frames 12 which may be incorporated into the metal strip 10 is limited only by the capability of a manufacturer's machines for semiconductor die attachment and die excising.

The paddle frame 12 includes the left and right side rails 14, 16 which are joined by cross-members 26. The generally centrally located metal paddle 22 is supported from the left and right side rails 14, 16 and cross-members 26 by paddle support bars 24, 28. Generally, no leads for electrical conduction are provided, although one or more of the paddle support bars 24, 28 may be used as leads in certain specific instances as shown in FIG. 1. No narrow "leads" common in lead frames are required in the paddle frame 12, resulting in greater ease of manufacture and increased reliability (see FIG. 1A).

The paddle frame 12 may be formed of a thin film of metal such as aluminum, silver, copper, or Alloy "42." Typically, the metal paddle 22 is sized to completely cover the second major surface 38 of the semiconductor die 20 and preferably be somewhat larger. The thickness 44 of the metal paddle 22 is a function of the quantity of generated thermal energy, the semiconductor die size, the thermal conductivity of the semiconductor die attach material, and whether a packaging material overlies the metal paddle 22 in the final product. For generally low rates of heat generation, the paddle thickness 44 may be the minimum required by structural considerations. However, where the heat generation rate is very high, it may be necessary to increase the paddle thickness 44 to provide an increased heat sink capacity.

In many cases, the thickness 44 of the metal paddle 22 need only be sufficient to support the semiconductor die 20 prior to excision, and for uniform adherence to the semiconductor die 20. The paddle thickness 44 may typically range from about 0.5 µm to about 5 µm, but may vary from this range, particularly upwardly for enhancing heat sink capability. This range of paddle thickness 44 includes the typical thicknesses of lead frames of the prior art. Paddle frames 12 may be formed and joined to semiconductor dice 20 by tape automated bonding (TAB).

Figure 3:
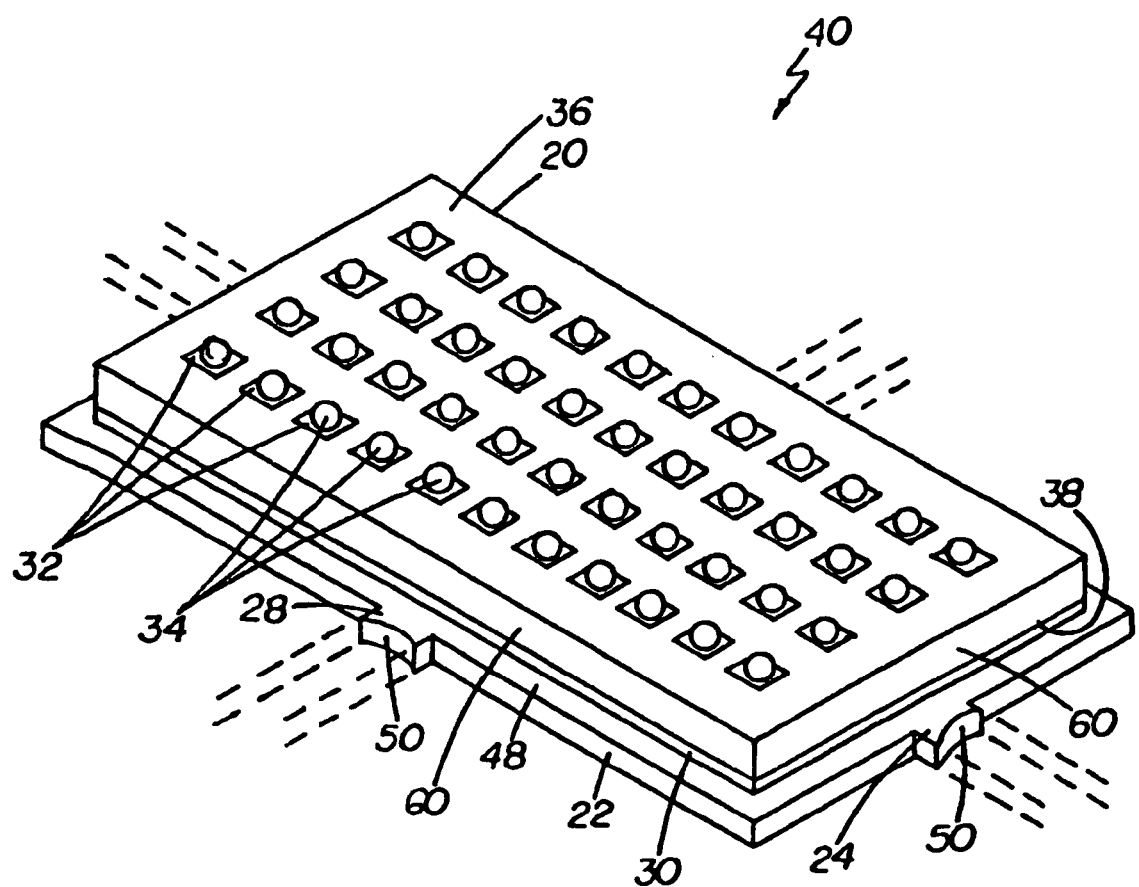
FIG. 3 is an enlarged perspective view of a semiconductor die bonded to a paddle of a paddle frame, furnished with a ball grid array and excised from the paddle frame in accordance with the chip scale package of the invention.

To singulate each semiconductor device assembly 40, the paddle support bars 24, 28 are excised close to the metal paddle 22 with excisions 50 (see drawing FIG. 3).

Illustrated in drawing FIGS. 1 and 1A is a plurality of semiconductor dice 20 with conductive bond pads 32 on the first major surface 36, i.e. the "active" surface. While drawing FIGS. 1 and 1A show the conductive bond pads 32 along the periphery of the semiconductor dice 20, thus limiting the number of conductive bond pads, the invention may be used for semiconductor dice having a full grid array of semiconductive bond pads as shown in drawing FIGS. 2 and 3.

In a preferred embodiment, conductive projections 34 such as solder bumps or balls are formed on the conductive bond pads 32, the projections enabling "gang" bonding, i.e., flip-chip bonding, of the semiconductor die bond pads to the conductive traces 46 of a substrate 42 such as a circuit board. This is illustrated in drawing FIGS. 4 and 5, which show a plurality of semiconductor device assemblies 40 flipped and bonded to circuit connections, e.g., conductive traces 46 (see drawing FIG. 5), of a substrate 42 comprising a circuit board. The internal circuitry within the substrate 42 is not shown, being irrelevant to the invention. The semiconductor device assemblies 40 may be bonded to a substrate 42 in a high density pattern and, being "bare" semiconductor dice 20, take up minimal space. The bonding may be completed by standard "flip-chip" methods, including thermal and/or pressure processes.

Each semiconductor device assembly 40 has a heat sink/spreader/dissipater 52 which was formerly a metal paddle 22 of a metal paddle frame 12. The heat sink/spreader/dissipater 52 has a generally exposed surface 54 for dissipating heat generated in the semiconductor device assembly 40.

Figure 5:
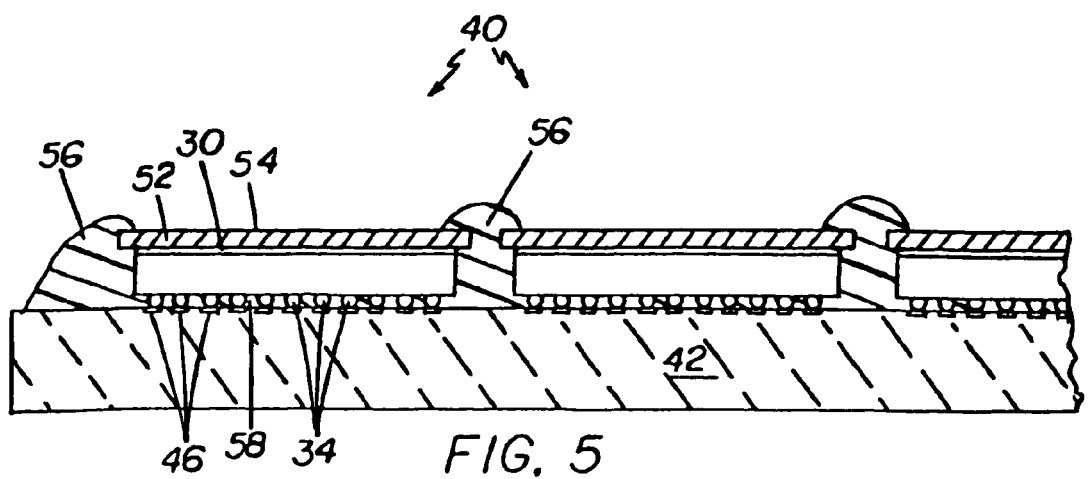
FIG. 5 is a cross-sectional side view of a circuit board upon which are reversibly mounted and resin-packaged, paddle-bonded semiconductor dice with ball grid arrays, in accordance with the heat-spreading chip scale package of the invention.

As depicted in drawing FIG. 5, a sealant material 56 may be applied to the periphery of a semiconductor device assembly 40 and the space 58 between the semiconductor device assembly 40 and the substrate 42. The sealant material 56 seals the semiconductor device assembly 40 to the substrate 42 and protects the semiconductor device assembly from moisture, etc. The spaces between adjacent semiconductor device assemblies 40 may be readily filled with sealant material 56. The space 58 may be filled, for example, by injecting sealant material 56 through holes, not shown, in the substrate 42. Preferably, surface 54 of the heat sink/spreader/dissipater 52 is largely left uncovered to provide high heat dissipation.

Any sealant material 56 useful in packaging semiconductor device assemblies may be used, including, e.g., epoxy, polyimide, etc.

A method of producing the semiconductor device assembly 40 includes the steps of:

1. producing a plurality of semiconductor dice 20 with integrated circuits as a wafer, each semiconductor die 20 having a first major surface 36 defined as an active surface with an array of conductive bond pads 32, i.e., input/output (I/O) pads, and a second, opposite major surface 38;

2. separating the individual semiconductor die 20 from the wafer;

3. providing a conductive "paddle frame" metal strip 10 with multiple paddle frames 12, each paddle frame having a heat conductive metal paddle 22 connected to left and right side rails 14, 16 and cross-members 26 of the paddle frame 12 by paddle support bars 24, 28;

4. bonding a semiconductor die 20 to each metal paddle 22 of the paddle frame metal strip 10 with a thin semiconductor die attach layer 30 of adhesive or adhesive tape of, e.g., epoxy or polyimide. The adhesive semiconductor die attach layer 30 may be provided with enhanced heat conductive properties. Alternatively, the second major surface 38 of the semiconductor die 20 may be bonded to the metal paddle 22 eutectically by formation of, e.g., a gold-silicon eutectic semiconductor die attach layer 30 or other electrically conductive material such as a specially designed polyimide.

5. conductive projections 34, i.e., balls or bumps (stud bumps) for reflow may be formed on the I/O conductive bond pads 32 of the semiconductor dice 20 either prior to or following attachment of the semiconductor dice to the metal paddles 22;

6. the semiconductor dice 20 may be tested in sequence in strip form, i.e., while the metal paddles 22 with attached semiconductor dice are connected to the paddle frame metal strip 10. A test head (not shown) is placed to make temporary electrical connection with the conductive bond pads 32 or conductive projections 34 for the conduction of parametric and functional tests. The testing may include additional tests typical of "burn-in" testing;

7. the paddle support bars 24, 28 connecting the paddles 22 to the paddle frame 12 are excised to free each semiconductor device assembly 40;

The semiconductor device assemblies 40 so produced are configured for mounting in a "flip-chip" configuration, i.e., face down on a substrate 42 such as a circuit board, e.g., by reflowing under heat and/or by pressure or other methods as known in the art.

The metal paddle 22 attached to the second major surface 38 of each semiconductor die 20 comprises a heat sink/spreader/dissipater 52 which prevents overheating of the semiconductor device assembly 40 (a) during testing (including burn-in), (b) during mounting on the substrate 42, (c) during packaging, and (d) in actual operation.

Following attachment to a substrate 42 such as a circuit board, the semiconductor device assembly 40 may be sealed with an electrically insulating sealant material 56 to produce a partially encapsulated package. The exposed surface 54 of the heat sink/spreader/dissipater 52 is preferably left largely uncovered, or is only thinly covered with the sealant material 56. The sealant may be any of the polymeric materials commonly used for packaging, including those used for "glob-top." Examples of such materials are epoxy resins and polyimides.

The invention is particularly applicable to high density integrated circuit semiconductor device assemblies 40 having a large number of interconnections, i.e., conductive bond pads 32. Such devices may produce significant quantities of thermal energy which, if not removed, may lead to destruction of the integrated circuit. The bare semiconductor dice 20 of the invention may be densely mounted on a substrate 42 and then sealed by introducing a sealant material 56 between the substrate and semiconductor dice to surround the electrical connections and the first major or active surfaces 36 and edges 60 of the semiconductor dice 20.

Major advantages of the invention are as follows:
1. The ease of device handling is enhanced. The semiconductor dice 20 are fixed to the unseparated metal paddles 22 of the "paddle frame" 12 during the test process and each semiconductor device assembly 40 can be handled without touching the semiconductor die. Once the semiconductor device assembly 40 is separated from the paddle frame 12 by excision of the paddle support bars 24, 28, the metal paddle 22 becomes a heat sink/spreader/dissipater 52, and the device may be handled and supported solely thereby.

2. Current methods of lead frame production may be used to produce the paddle frame metal strip 10. The paddle frames 12 are much simpler in design than lead frames, there being few or no electrical leads.

3. Semiconductor dice or multiple chips 20 may be mounted on a single paddle frame metal strip 10, using equipment widely used by device manufacturers. Thus, reliable attachment of the semiconductor dice 20 to the metal paddles 22, testing (and burn-in) of the semiconductor dice, separation of the paddle mounted semiconductor dice from the paddle frame metal strip 10, and mounting of the semiconductor dice on a substrate 42 may be easily accomplished using well-developed and common assembly equipment and methods. The readily aligned semiconductor die attach apparatus, test head, and lead excision apparatus enable accuracy and ease of operation in the device assembly.

4. The heat sink/spreader/dissipater 52 of the invention results in better temperature control and increased reliability of the semiconductor device assembly 40.

5. Use of known technology and equipment results in a lower assembly cost. No additional specially designed equipment is required.

6. A dense chip-size bare semiconductor device assembly 40 of low profile is produced for dense attachment to a circuit board or other substrate 42.

It is apparent to those skilled in the art that various changes and modifications may be made to the semiconductor die with the heat spreader/dissipater and the novel method of manufacturing, testing and installing the semiconductor die of the invention as disclosed herein without departing from the spirit and scope of the invention as defined in the following claims.

The invention claimed is:

1. A semiconductor device assembly of a plurality of semiconductor device assemblies, comprising:
   a semiconductor die having an active surface having a plurality of bond pads thereon and an opposing second surface;
   at least one projection connected to at least one bond pad of the plurality of bond pads on the active surface of the semiconductor die for flip-chip bonding to a substrate, the at least one projection including one of at least one solder ball and at least one solder bump; and
   a paddle frame of a plurality of paddle frames including a pair of side rails, a plurality of cross-members, and a plurality of generally centrally positioned paddles, the pair of side rails and the plurality of cross-members connected to a generally centrally positioned paddle of the paddle frame by a plurality of paddle support bars, the second surface of the semiconductor die being secured to the paddle, the paddle being attached to the side rail by at least two of the plurality of paddle support bars and being attached to the cross-members by at least two of the plurality of support bars.

2. The semiconductor device assembly of claim 1, wherein the at least one projection includes a plurality of projections comprising a ball grid array (BGA) of solder balls.

3. The semiconductor device assembly of claim 1, wherein the at least one projection comprises at least one ball deposited by a wire bonding machine.

4. The semiconductor device assembly of claim 1, wherein the at least one projection comprises at least one stud bump deposited by a wire bonding machine.

5. The semiconductor device assembly of claim 1, further comprising:
   an electrically non-conductive adhesive layer securing the second surface to the generally centrally positioned paddle.

6. The semiconductor device assembly of claim 5, wherein the adhesive layer comprises one of epoxy and polyimide.

7. The semiconductor device assembly of claim 1, further comprising:
   an electrically conductive adhesive layer securing the second surface of the semiconductor die to the generally centrally positioned paddle.

8. The semiconductor device assembly of claim 7, wherein the electrically conductive adhesive layer comprises a eutectic material.

9. The semiconductor device assembly of claim 7, wherein the electrically conductive adhesive layer comprises a gold-silicon eutectic material.

10. The semiconductor device assembly of claim 7, wherein the electrically conductive adhesive layer comprises a metal-filled polymer, the metal filling comprising a heat conductive material.

11. The semiconductor device assembly of claim 7, wherein the electrically conductive adhesive layer comprises conductive polyimide.

12. A semiconductor device assembly of a plurality of semiconductor device assemblies, comprising:
   a semiconductor die having an active surface having at least one bond pad thereon and an opposing second surface;
   at least one projection secured to the at least one bond pad on the active surface of the semiconductor die configured for flip-chip connection to a substrate, the at least one projection including one of at least one solder ball and at least one solder bump; and
   a metal paddle from a paddle frame having no narrow common electrical leads for connection to the semiconductor die of a plurality of paddle frames connected by a pair of rails having a plurality of cross-members therebetween, the second surface of the semiconductor die being attached to the paddle, the metal paddle attached to at least one side rail by at least a plurality of paddle support bars and being attached to a plurality of cross-members by the support bars, the paddle support bars not used for electrical leads for the semiconductor die.

13. The semiconductor device assembly of claim 12, wherein the at least one projection comprises a ball grid array (BGA) of solder balls.

14. The semiconductor device assembly of claim 12, wherein the at least one projection comprises at least one ball deposited by a wire bonding machine.

15. The semiconductor device assembly of claim 12, wherein the at least one projection comprises at least one stud bump deposited by a wire bonding machine.

16. The semiconductor device assembly of claim 12, further comprising:
   an electrically non-conductive adhesive layer attaching the second surface to the paddle.

17. The semiconductor device assembly of claim 16, wherein the adhesive layer comprises one of epoxy and polyimide.

18. The semiconductor device assembly of claim 12, further comprising:
   an electrically conductive adhesive layer attaching the second surface to the metal paddle.

19. The semiconductor device assembly of claim 18, wherein the electrically conductive adhesive layer comprises a eutectic material.

20. The semiconductor device of claim 18, wherein the electrically conductive adhesive layer comprises a gold-silicon eutectic material.

21. The semiconductor device assembly of claim 19, wherein the electrically conductive adhesive layer comprises a metal-filled polymer, the metal filling comprising a heat conductor.

22. The semiconductor device assembly of claim 19, wherein the electrically conductive layer comprises conductive polyimide.

23. The semiconductor device assembly of claim 12, further comprising:
   a substrate having a plurality of circuit connections, the at least one bond pad connected to at least one circuit connection of the plurality of circuit connections.

24. The semiconductor device assembly of claim 23, further comprising:
   sealant packaging covering a portion of the semiconductor die and a portion of the substrate.

25. A semiconductor device assembly of a plurality of semiconductor device assemblies, comprising:
   a semiconductor die having an active surface having a plurality of bond pads thereon and an opposing second surface;
   a plurality of projections connected to the plurality of bond pads for direct connection to a host circuit board, the plurality of projections including one of a plurality of solder balls and a plurality of solder bumps; and
   a metallic paddle having no electrical leads for connection to a semiconductor die secured to the second surface of the semiconductor die, the metallic paddle being attached to at least one side rail by at least a plurality of paddle support bars that include one of being used as a lead and not being used as a lead and being attached to a plurality of cross-members by the support bars of a paddle frame.

26. The semiconductor device assembly of claim 25, wherein the plurality of projections comprises a ball grid array (BGA) of solder balls.

27. The semiconductor device assembly of claim 25, wherein the plurality of projections comprises balls deposited by a wire bonding machine.

28. The semiconductor device assembly of claim 25, wherein the plurality of projections comprises a plurality of stud bumps deposited by a wire bonding machine.

29. The semiconductor device assembly of claim 25, further comprising:
   an electrically non-conductive adhesive layer connecting the second surface to the metallic paddle.

30. The semiconductor device assembly of claim 29, wherein the adhesive layer comprises one of epoxy and polyimide.

31. The semiconductor device assembly of claim 25, further comprising:

an electrically conductive adhesive layer connecting the second surface to the metallic paddle.

32. The semiconductor device assembly of claim 31, wherein the electrically conductive adhesive layer comprises a eutectic material.

33. The semiconductor device assembly of claim 31, wherein the electrically conductive adhesive layer comprises a gold-silicon eutectic material.

34. The semiconductor device assembly of claim 31, wherein the electrically conductive adhesive layer comprises a metal-filled polymer, the metal filling comprising a heat conductive material.

35. The semiconductor device assembly of claim 31, wherein the electrically conductive adhesive layer comprises conductive polyimide.

36. The semiconductor device of claim 25, further comprising:

a substrate having a plurality of circuit connections, the plurality of bond pads connected to the plurality of circuit connections.

37. The semiconductor device assembly of claim 36, further comprising:

sealant packaging covering a portion of the semiconductor die and a portion of the substrate.

* * * * *